(12) United States Patent
Madrid

(10) Patent No.: US 8,193,618 B2
(45) Date of Patent: Jun. 5, 2012

(54) SEMICONDUCTOR DIE PACKAGE WITH CLIP INTERCONNECTION

(75) Inventor: Ruben P. Madrid, Talisay (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 616 days.

(21) Appl. No.: 12/334,249

(22) Filed: Dec. 12, 2008

(65) Prior Publication Data

US 2010/0148327 A1    Jun. 17, 2010

(51) Int. Cl.
  *H01L 23/495*   (2006.01)
  *H01L 21/60*    (2006.01)

(52) U.S. Cl. ........ 257/670; 257/578; 257/584; 257/666; 257/675; 257/676; 257/690; 257/726; 257/727; 257/E23.031; 257/E23.033; 438/111; 438/122; 438/123

(58) Field of Classification Search .......... 257/578, 257/584, 666, 670, 676, 690, 726, 727, E23.031, 257/E23.033, E23.061; 438/111, 122, 123
See application file for complete search history.

(56) References Cited

U.S. PATENT DOCUMENTS

| | | |
|---|---|---|
| 3,956,821 A | 5/1976 | Martin |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |

(Continued)

FOREIGN PATENT DOCUMENTS

JP   2008-153432 A   7/2008

OTHER PUBLICATIONS

U.S. Appl. No. 11/626,503, filed Jan. 24, 2007.

*Primary Examiner* — Eugene Lee
*Assistant Examiner* — Peniel M Gumedzoe
(74) *Attorney, Agent, or Firm* — Kilpatrick Townsend & Stockton LLP

(57) ABSTRACT

A semiconductor die package. The semiconductor die package includes a leadframe structure comprising a first lead structure comprising a die attach pad, a second lead structure, and a third lead structure. It also includes a semiconductor die comprising a first surface and a second surface. The semiconductor die is on the die attach pad of the leadframe structure. The first surface is proximate the die attach pad. The semiconductor die package further includes a clip structure comprising a first interconnect structure and a second interconnect structure, the first interconnect structure comprising a planar portion and a protruding portion, the protruding portion including an exterior surface and side surfaces defining the exterior surface. The protruding portion extends from the planar portion of the first interconnect structure. The second surface of the semiconductor die is proximate to the clip structure, and a molding material covers at least the semiconductor die and at least a portion of the side surfaces of the protruding portion.

20 Claims, 14 Drawing Sheets

U.S. PATENT DOCUMENTS

| | | |
|---|---|---|
| 6,329,706 B1 | 12/2001 | Nam |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,489,678 B1 | 12/2002 | Joshi |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,870,254 B1 * | 3/2005 | Estacio et al. ............ 257/692 |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 7,371,616 B2 | 5/2008 | Jereza |
| 7,439,613 B2 | 10/2008 | Joshi et al. |
| 2005/0218498 A1 * | 10/2005 | Hata et al. ............ 257/690 |
| 2006/0017142 A1 * | 1/2006 | Jang et al. ............ 257/672 |
| 2007/0057368 A1 * | 3/2007 | Ho et al. ............ 257/735 |
| 2007/0155058 A1 | 7/2007 | Jereza |
| 2008/0023807 A1 * | 1/2008 | Noquil et al. ............ 257/675 |
| 2008/0087992 A1 * | 4/2008 | Shi et al. ............ 257/670 |
| 2008/0173991 A1 | 7/2008 | Cruz et al. |
| 2009/0057852 A1 * | 3/2009 | Madrid ............ 257/670 |
| 2009/0057855 A1 * | 3/2009 | Quinones et al. ............ 257/676 |

\* cited by examiner

US 8,193,618 B2

SEMICONDUCTOR DIE PACKAGE WITH CLIP INTERCONNECTION

CROSS-REFERENCES TO RELATED APPLICATIONS

Not Applicable

BACKGROUND

Power semiconductor die packages are known and are used in computers and the like. One type of power semiconductor die package is a PQFN (power quad flat no-lead) type package. This type of package does have leads, but they do not extend past lateral surfaces of the molding material that encapsulates a semiconductor die.

An exemplary semiconductor die package is shown in FIG. 14. FIG. 14 shows a semiconductor die 108, which is sandwiched between a drain clip 101 and a die attach pad 103, which connects to a source region in the semiconductor die. The drain clip 101 is coupled to a drain lead 177 using solder 118.

While the semiconductor die package shown in FIG. 14 is effective, improvements could be made. First, power semiconductor die packages generate a significant amount of heat. It would be desirable to improve upon semiconductor die packages so that they can dissipate more heat. Second, the bottom of the semiconductor die package shown in FIG. 14 has an exposed source pad structure. This type of structure is not compatible with MLP (micro leadframe package) and SO8 types of semiconductor die packages. Third, the clip connection to the drain lead 177 is a difficult, because it needs to be bent and aligned with a downset portion of the drain clip 101. The somewhat complicated structure also makes the semiconductor die package more expensive to produce. Fourth, the limited amount of space associated with the source die attach pad can limit the size of the dies used in the semiconductor die package.

It would be desirable to provide for a semiconductor die package that can address these and other problems. Embodiments of the invention can address the above problems, and other problems, individually and collectively.

BRIEF SUMMARY

Embodiments of the invention include semiconductor die packages, as well as methods for making semiconductor die packages.

One embodiment of the invention is directed to a semiconductor die package. The semiconductor die package comprises a leadframe structure comprising a first lead structure (e.g., a drain lead structure) comprising a die attach pad, a second lead structure (e.g., a source lead structure), and a third lead structure (e.g., a gate lead structure). It also comprises a semiconductor die comprising a first surface and a second surface. The semiconductor die is on the die attach pad of the leadframe structure, and the second surface is proximate the die attach pad. The semiconductor die package further comprises a clip structure (e.g., a dual gauge clip structure) comprising a first interconnect structure and a second interconnect structure, and a protruding portion comprising an exterior surface and side surfaces defining the exterior surface, where the protruding portion extends from the first interconnect structure. The first surface of the semiconductor die is proximate to the clip structure, and a molding material covers at least the semiconductor die and at least a portion of the side surfaces of the protruding portion.

Another embodiment of the invention is directed to a method of making a semiconductor die package. The method including: a) obtaining an array of leadframe structures, each leadframe structure comprising a first lead structure comprising a die attach pad, a second lead structure, and a third lead structure; b) attaching a plurality of semiconductor dies to the die attach pads of the leadframe structures in the array of leadframe structures; c) attaching an array of clip structures to the semiconductor dies in the plurality of semiconductor dies, wherein each clip structure comprises a first interconnect structure and a second interconnect structure, the first interconnect structure comprising a planar portion and a protruding portion comprising an exterior surface and side surfaces defining the exterior surface, the protruding portion extending from the planar portion of the first interconnect structure; and d) molding a molding material around at least a portion of the clip structures, semiconductor dies, and leadframe structures. The exterior surface of each of the clip structures is exposed through the molding material.

Other embodiments of the invention are directed to electrical assemblies and systems.

These and other embodiments of the invention are described in further detail below, with reference to the Figures and the Detailed Description.

BRIEF DESCRIPTION OF THE DRAWINGS

In the Figures, like numerals designate like elements, and the descriptions of some elements may not be repeated.

Exemplary dimensions are shown in the Figures. Embodiments of the invention are not limited to such exemplary dimensions.

DETAILED DESCRIPTION

One embodiment of the invention is directed to a semiconductor die package. The semiconductor die package comprises a leadframe structure comprising a first lead structure comprising a die attach pad, a second lead structure, and a third lead structure. It also comprises a semiconductor die comprising a first surface and a second surface. The second surface is proximate the die attach pad. The semiconductor die package further comprises a clip structure comprising a first interconnect structure and a second interconnect structure, which may have portions which lie within the same plane. The first interconnect structure comprises a planar portion and a protruding portion comprising an exterior surface and side surfaces defining the exterior surface. The protruding portion extends from the planar portion of the first interconnect structure. The first surface of the semiconductor die is proximate to the clip structure, and a molding material covers at least the semiconductor die and at least a portion of the side surfaces of the protruding portion. The semiconductor die packages according to embodiments of the invention can be PQFN (power quad flat no lead) type packages.

Figure 1:
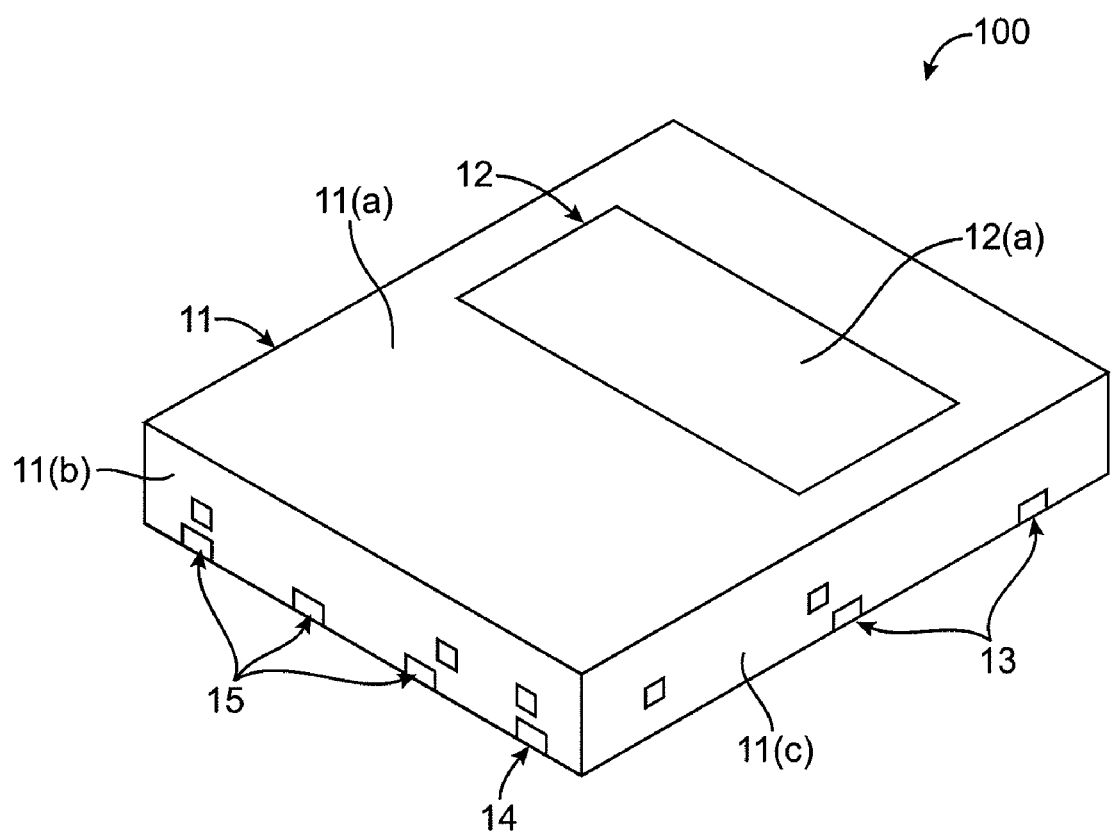
FIG. 1 shows a three-dimensional, top perspective view of a semiconductor die package according to an embodiment of the invention.

FIG. 1 shows a top, perspective view of a semiconductor die package 100 according to an embodiment of the invention. The semiconductor die package 100 comprises a molding material 11 which includes exterior surfaces including a top surface 11(a), and side surfaces 11(b), 11(c) substantially perpendicular to the top surface 11(a).

The molding material 11 surrounds and covers at least side surfaces of a protruding portion 12. The protruding portion 12 is part of a first interconnect structure (e.g., a source interconnect structure) and extends from a planar portion of the first interconnect structure. If the semiconductor die package is a power MOSFET die package, the first interconnect structure may be physically and electrically coupled to a source region in a semiconductor die (not shown) in the semiconductor die package 100. The protruding portion 12 contains an exterior surface 12(a), which is exposed through and is substantially coplanar with a top, exterior surface 11(a) of the molding material 11. The exterior surface 12(a) of the protruding portion 12 may be defined by sides, which are covered by the molding material 11. The exterior surface 11(a) may be a first surface of the molding material 11, and the molding material may have a second surface (not shown) on the opposite side of the semiconductor die package 100. The exposed exterior surface 12(a) of the protruding portion 12 provides a very efficient path for dissipating heat from a semiconductor die in the semiconductor die package 100. The physical configuration of the protruding portion 12 allows the molding material to be secured to it.

The semiconductor die package 100 also comprises a number of input and output leads. In FIG. 1, the end surfaces of a plurality of source leads 15 and a gate lead 14 are exposed by and substantially coplanar with a side surface 11(b) of the molding material 11. The source leads 15 may be part of a leadframe structure, and may provide source terminals for a source region in the semiconductor die.

End surfaces of a plurality of tie bars 13 are exposed by and substantially coplanar with another side surface 11(c) of the molding material. The tie bars 13 are used to join a leadframe structure in the semiconductor die package 100 with other leadframe structures in an array of leadframe structures during the manufacturing process.

Figure 2:
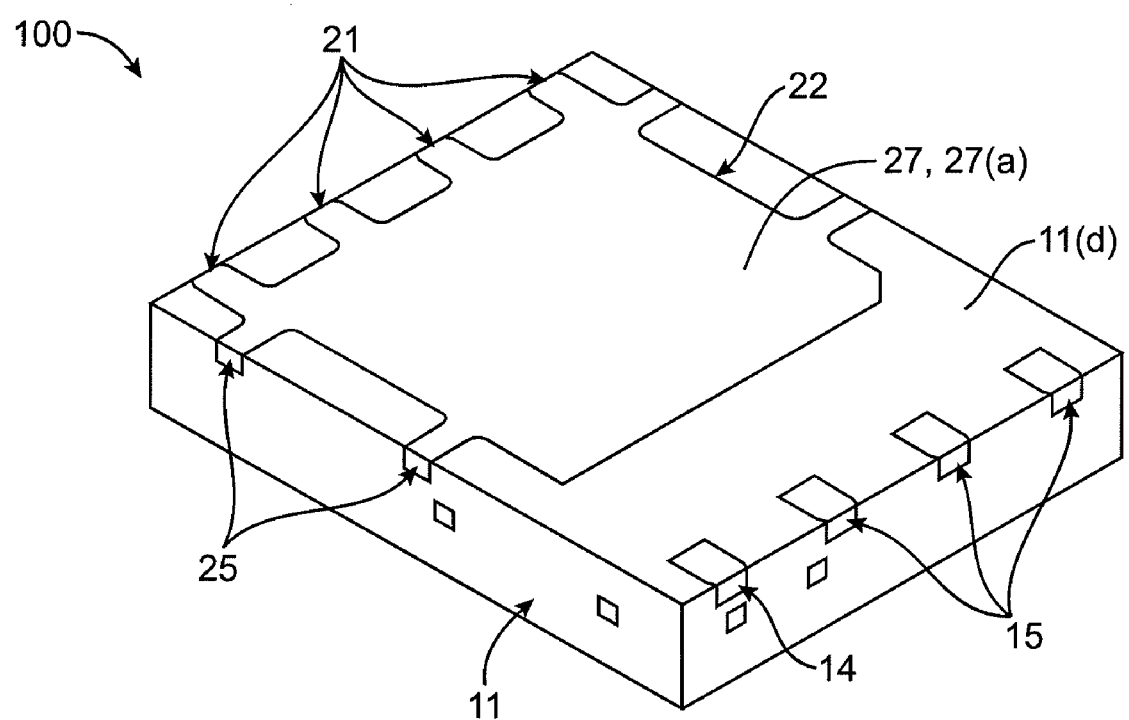
FIG. 2 shows a three-dimensional, bottom perspective view of the semiconductor die package shown in FIG. 1.

FIG. 2 shows a bottom, perspective view of the semiconductor die package embodiment shown in FIG. 1.

The molding material 11 in the semiconductor die package 100 comprises a bottom exterior surface 11(d), which exposes and is substantially coplanar with a bottom, exterior surface 27(a) of a drain pad 27 of a drain lead structure 22. Drain leads 21 extend from the drain pad 27, and terminate at a side surface of the molding material 11. Tie bars 25 also extend from the drain pad 27 and are perpendicular to the drain leads 21. The source leads 15 and the gate lead 14 are at the opposite side of the semiconductor die package 100 as the drain leads 21.

In the semiconductor die package 100 shown in FIG. 1, there are four drain leads 21, three source leads 15, and one gate lead 14. There may be more or less drain, source, and gate leads in other semiconductor die package embodiments.

Figure 3:
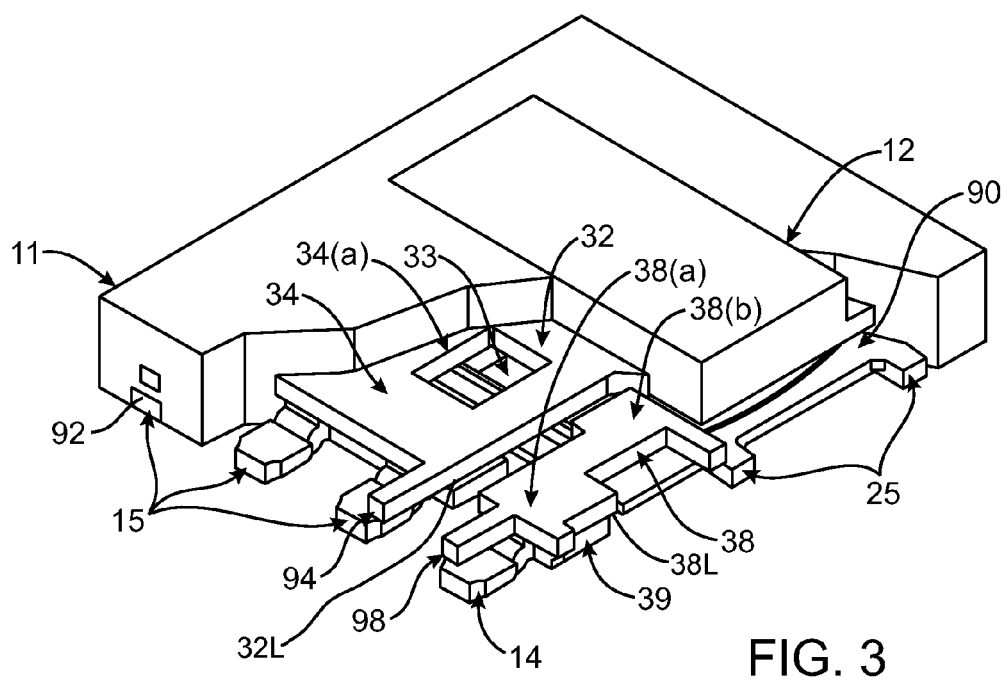
FIG. 3 shows a three-dimensional top, cut-away view of a semiconductor die package according to an embodiment of the invention.

FIG. 3 shows a top, perspective view of the semiconductor die package 100 shown in FIG. 1, with part of the molding material 11 removed so that internal components of the semiconductor die package 100 can be seen. As shown, the molding material 11 covers at least a portion of a clip structure including a first interconnect structure such as a source interconnect structure 32 and a second interconnect structure such as a gate interconnect structure 38. The source interconnect structure 32 and the gate interconnect structure 38 may be respectively coupled to the source region and gate region at a first surface of a semiconductor die 33. The bottom surface of source interconnect structure 32 is indicated by reference number 32L, and the bottom surface of gate interconnect structure 38 is indicated by reference number 38L. The semiconductor die 33 may be sandwiched between the clip structure including the source and gate interconnect structures 32, 38, and a leadframe structure 90.

Figure 13:
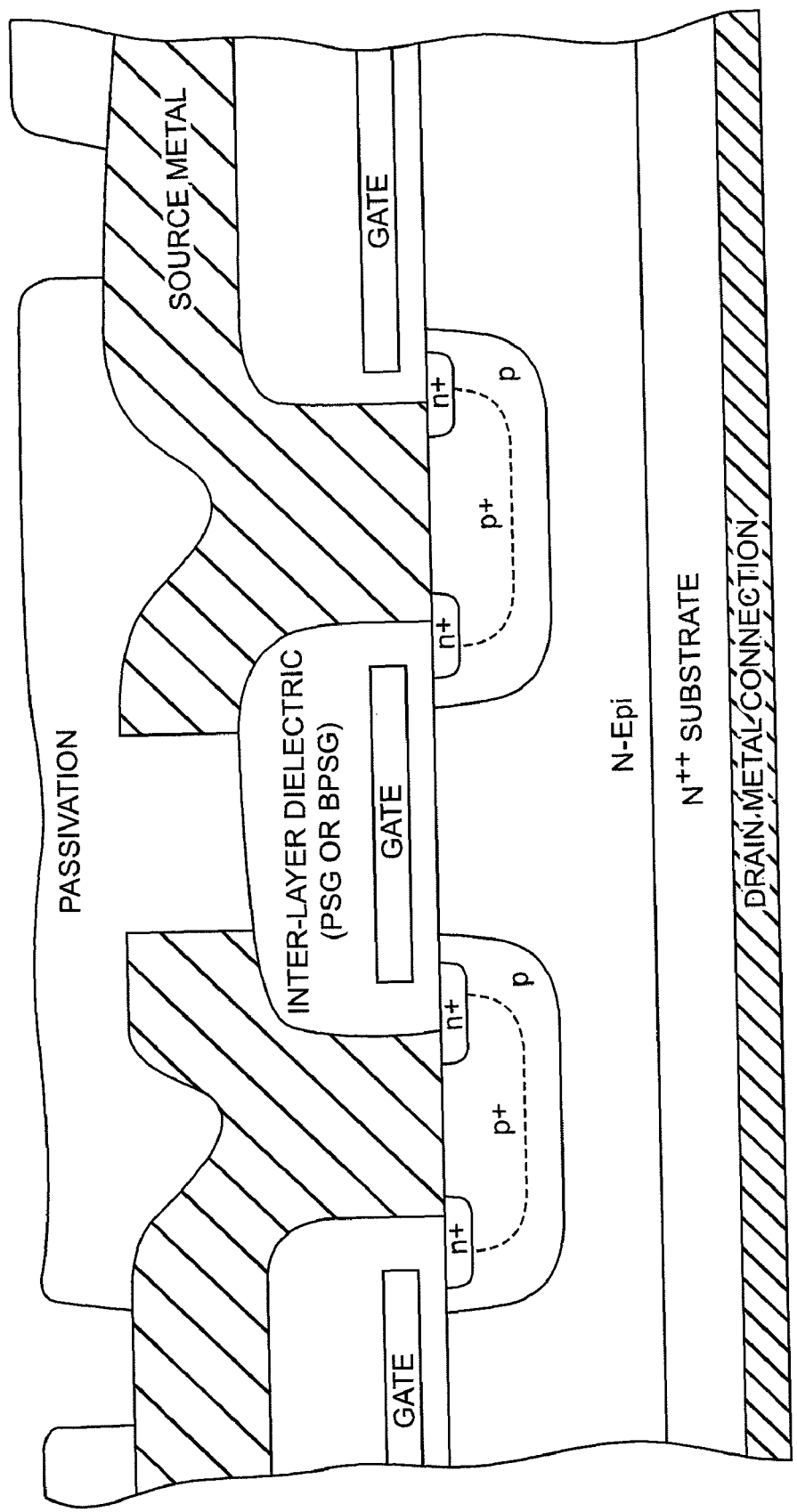
FIG. 13 shows a side, cross-sectional view of a vertical power MOSFET.
Figure 14:
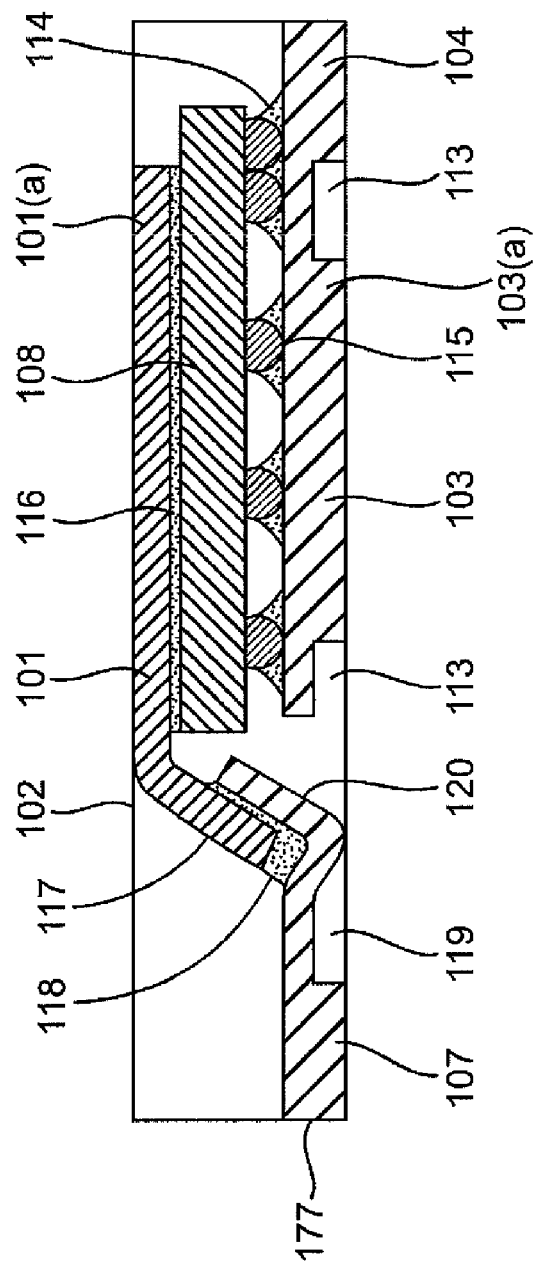
FIG. 14 shows a side, cross-sectional view of a conventional semiconductor die package.

A semiconductor die 33 in the semiconductor die package 100 may comprise any suitable type of device, including a power MOSFET. While power MOSFETs are described in detail, any suitable vertical power transistor can be used in embodiments of the invention. Vertical power transistors include VDMOS transistors and vertical bipolar transistors. A VDMOS transistor is a MOSFET (an example of which is shown in FIG. 13) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. Other electrical devices such as vertical resistors, capacitors, etc. may also be used in embodiments of the invention. In embodiments of the invention, an input region can be at one surface of the semiconductor die, while an output region can be at the opposite surface of the semiconductor die.

The source interconnect structure 32 comprises the previously described protruding portion 12. The protruding portion 12 protrudes with respect to a planar portion 34 of a source interconnect structure 32. The protruding portion 12 may be at least two or three times as thick as the planar portion 34. The thickness of portion 12 can be about 0.5 mm or about 20 mils. The planar portion 32 and 34 can be about half the thickness of the protruding portion 12. The interconnect structure becomes a dual gauge structure in this case, due to the creation of the protruding portion 12.

The planar portion 34 of the source interconnect structure 32 may include a tie bar 94, and an aperture 34(a). The aperture 34(a) can be used as a mold locking mechanism and also to allow the smooth flow of molding compound. The aperture 34(a) may or may not be present in other embodiments of the invention.

The gate interconnect structure 38 includes a first portion 38(a) that electrically and mechanically couples to a gate region in the semiconductor die 33 and a second portion 38(b) that electrically and mechanically couples to a gate pad in a gate lead structure 39. The gate lead structure 39 may also include a gate lead 14. A tie bar 98 is also included in the gate interconnect structure 38.

The leadframe structure 90 can comprise the gate lead structure 39, as well as a source lead structure 92, which is electrically isolated from the gate lead structure 39. The source lead structure 92 may be electrically coupled to the source interconnect structure 32 using solder of the like.

The clip structure and the leadframe structure may be made by any suitable process. For example, they may be made using etching, stamping, or any combination thereof. The leadframe structure can also be made into a pre-formed dual gauge structure from a raw material. Further, the clip structure and the leadframe structure may comprise any suitable material(s). For example, they may include a base metal such as copper. The base metal may be or not be coated with another material. For example, in some embodiments, the base metal may be coated with a solderable metal.

Figure 4:
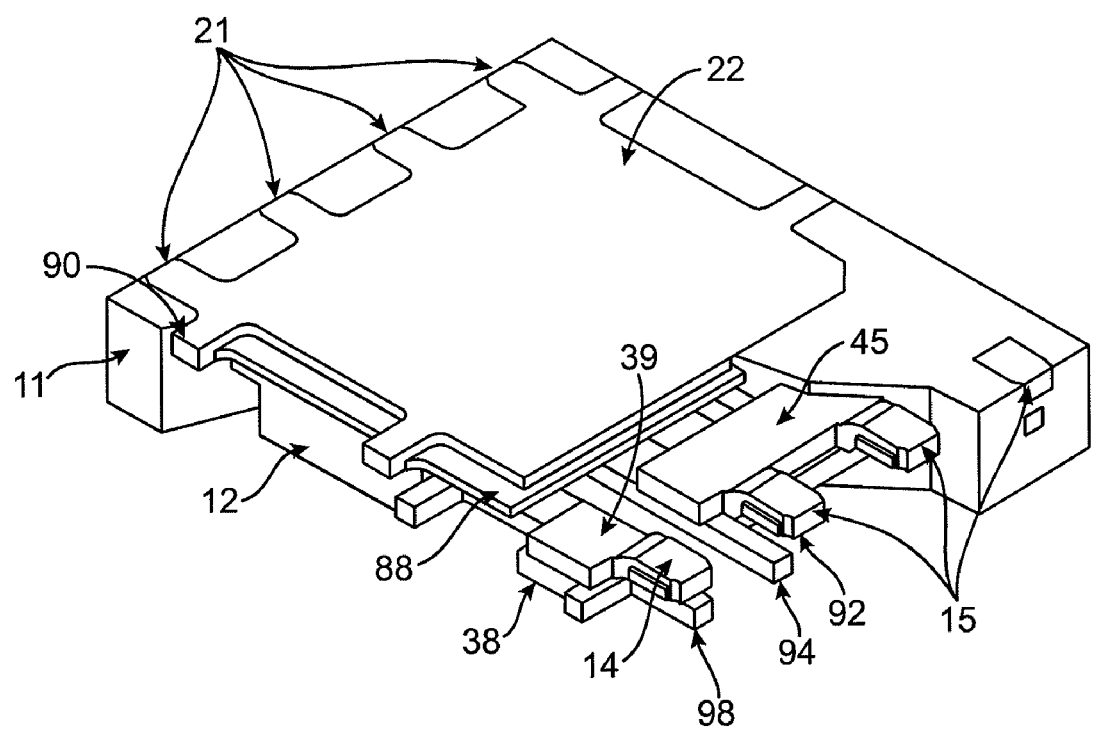
FIG. 4 shows a three-dimensional bottom, cut-away view of the semiconductor die package shown in FIG. 3.

FIG. 4 shows a bottom, perspective view of the semiconductor die package 100 shown in FIG. 1, with part of the molding material 11 removed so that internal components of the semiconductor die package 100 can be seen. As shown in FIG. 4, the drain lead structure 22 comprises a partially etched region 88 that can be filled with the molding material 11 so that the molding material 11 locks to the leadframe structure 90. FIG. 4 also shows a source lead post 45 in the source lead structure 92. The source lead post 45 has an orientation, which is substantially perpendicular to the orientation of the source leads 15.

Figure 5:
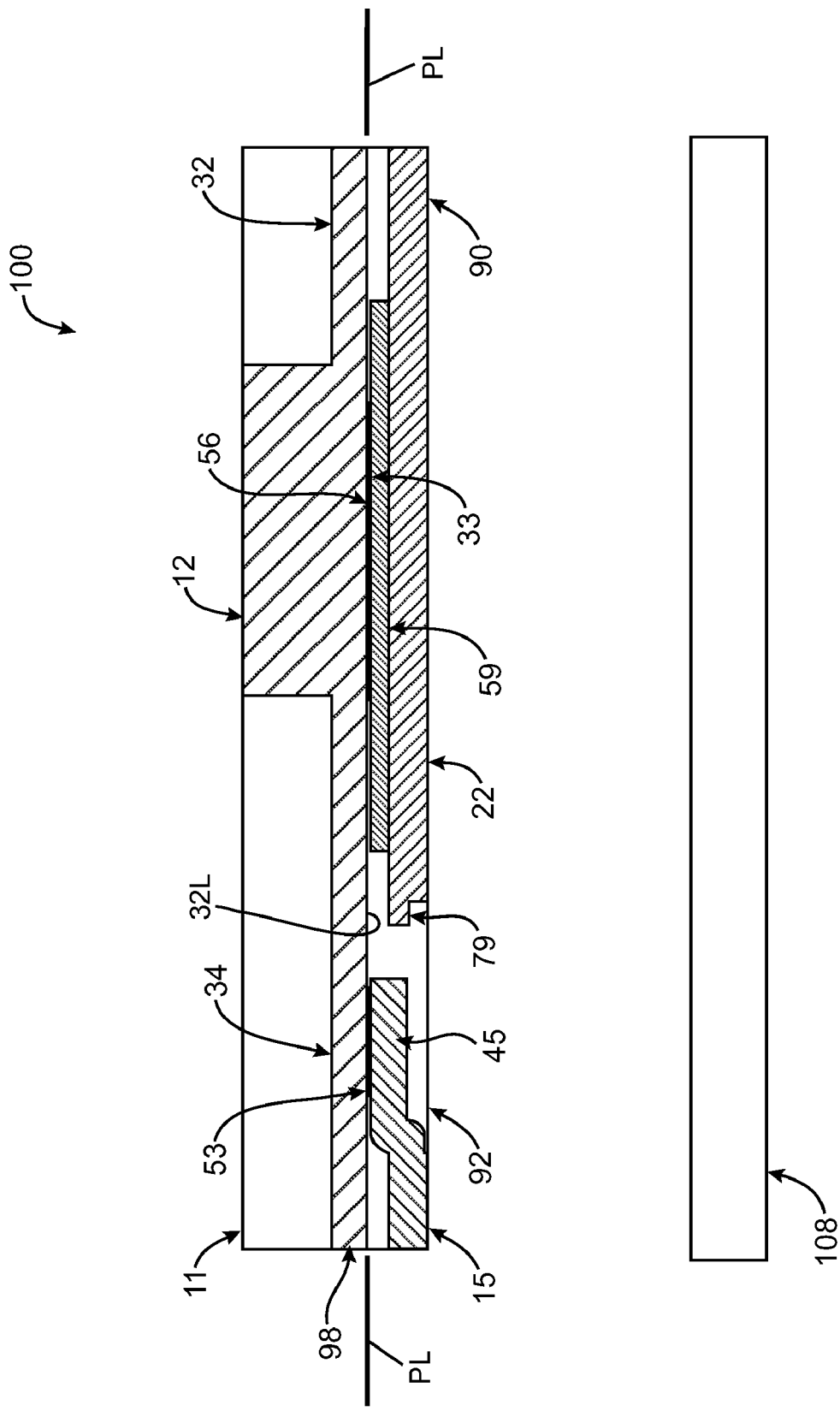
FIG. 5 shows a side, cross-sectional view of a semiconductor die package according to an embodiment of the invention, along with a circuit substrate.

As shown in FIG. 5, the bottom surface 32L of the source interconnect structure 32 is flat. The planar portion 34 (thinner gauge) can be about 0.3 mm (12.5 mils) thick and the protruding portion 12 can be about 0.50 mm (20 mils) thick. The dimensions of the interconnect structure 32 can be more or less than these dimensions in other embodiments. Bottom surface 32L defines a plane PL, at which bottom surface 32L faces the top surfaces of semiconductor die 33 and source lead post 45. Bottom surface 32L is not exposed by the package, and therefore is an interior surface. As can be seen in FIG. 3, gate interconnect structure 38 has a flat bottom surface 38L that is co-planar with bottom surface 32L, where bottom surface 38L is also an interior surface. The bottom surfaces 32L and 38L are completely flat in the embodiment shown in FIGS. 3 and 5. The source interconnect structure 32 is easy to manufacture, and easy to place on top of the semiconductor die 33 and the source lead structure 92. Also, as shown, the protruding portion 12 overlaps with a substantial portion (e.g., at least about 50% of the lateral surface area) of the semiconductor die 33. In some embodiments, the protruding portion 12 may have a thickness of about 8-20 mils, and the planar portion 34 may have a thickness less than about 10 mils.

Heat from the die 33 can pass to the outside environment through the protruding portion 12 as well as through the drain clip structure 33, to an underlying circuit substrate 108. The semiconductor die package 100 can be mounted on the circuit substrate to form an electrical assembly. For simplicity of illustration, circuit pads and lines in the circuit substrate 108 are not shown.

FIG. 5 shows a side, cross-sectional view of the previously described semiconductor die package 100 embodiment. As shown, a first surface of the semiconductor die 33 comprising a source region (and a gate region) can be electrically and mechanically coupled to the source interconnect structure 32 using a conductive adhesive 56 such as solder. A second surface of the semiconductor die 33 opposite the first surface may comprise a drain region, and may be electrically and mechanically coupled to the drain lead structure 22 using a second conductive adhesive 59 such as solder. The planar portion 34 of the source interconnect structure 32 can be electrically and mechanically coupled to the source lead post 45 using a conductive adhesive such as solder 53.

FIG. 5 also shows other features of the leadframe structure 90. They include an upset configuration in the source lead post 45 in the source lead structure 92, and a partially etched region 79 in the drain lead structure 22. The molding material 11 can fill the region under the source lead post 45 as well as the partially etched region 79.

The semiconductor die packages according to embodiments of the invention can be made in any suitable manner. In one embodiment of the invention, the method includes: a) obtaining an array of leadframe structures, each leadframe structure comprising a first lead structure comprising a die attach pad, a second lead structure, and a third lead structure; b) attaching a plurality of semiconductor dies to the die attach pads of the leadframe structures in the array of leadframe structures; c) attaching an array of clip structures to the semiconductor dies in the plurality of semiconductor dies, wherein each clip structure comprises a first interconnect structure and a second interconnect structure, and a protruding portion comprising an exterior surface and side surfaces defining the exterior surface, the protruding portion extending from the first interconnect structure; and d) molding a molding material around at least a portion of the clip structures, semiconductor dies, and leadframe structures, wherein the exterior surface of each of the clip structures is exposed through the molding material. In some embodiments of the invention, these steps may be performed in order. However, in other embodiments, the steps may be performed in a different order. For example, the array of clip structures could be attached to the semiconductor dies, before they are attached to the leadframe structures in other embodiments of the invention.

Methods according to embodiments of the invention can be described with reference to FIGS. 6-12. Some elements in these Figures are not discussed as they are already described above.

First, an array of leadframe structures is first obtained in any suitable manner including etching, stamping, etc.

Figure 6:
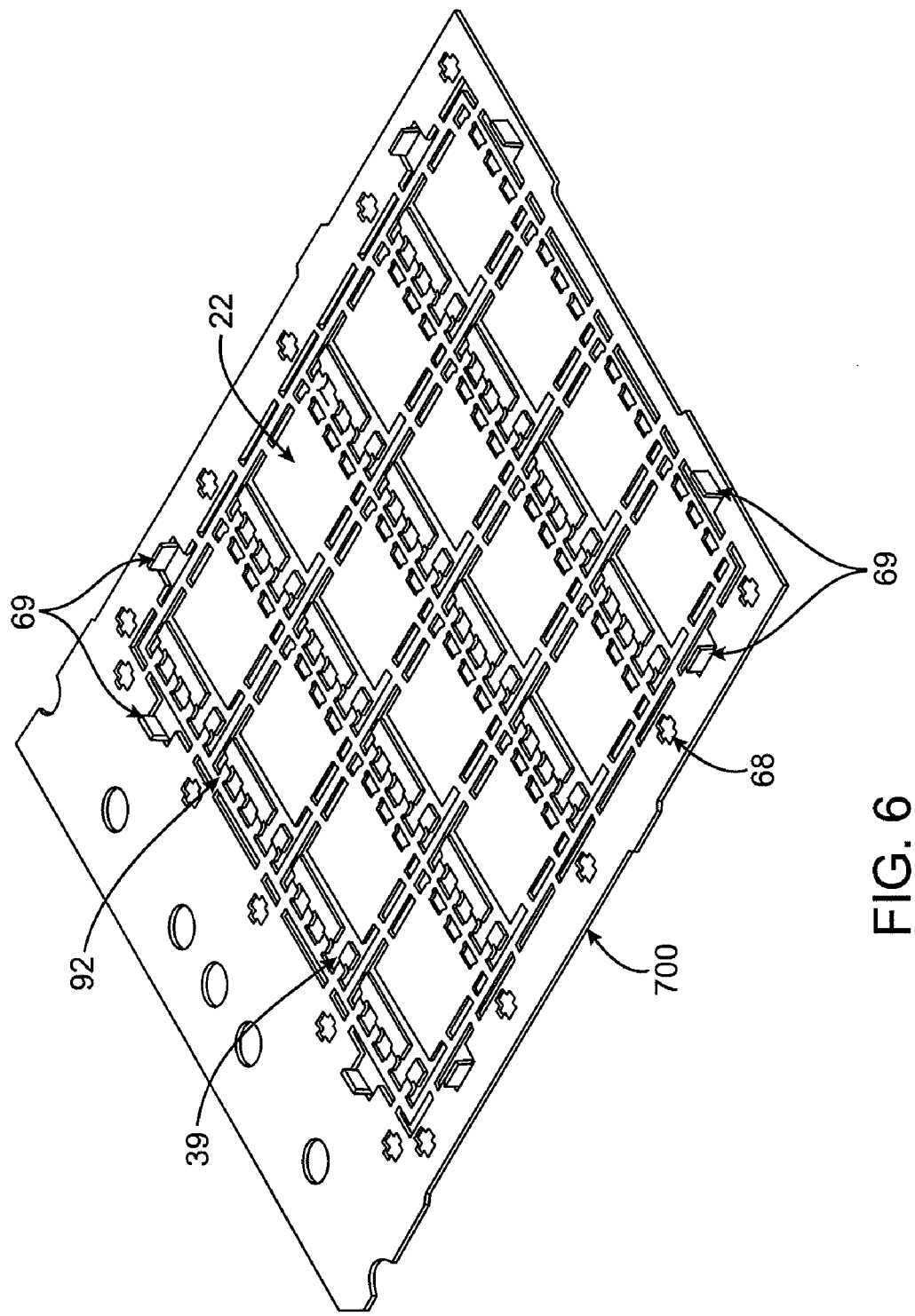
FIG. 6 shows a frame design with a folded tab for clip location.

A perspective view of an array of leadframe structures 700 is shown in FIG. 6. Each leadframe structure may comprise a first lead structure such as a drain lead structure 22 comprising a die attach pad, a second lead structure such as a source lead structure 92, and a third lead structure such as a gate lead structure 39. Also shown in FIG. 6 is an array of saw fiducials 68 as well as folded tabs 69 for aligning a clip array (not shown) with respect to the array of leadframe structures 700. The leadframe structures may have any suitable thickness including a thickness of about 8 mils.

Figure 7:
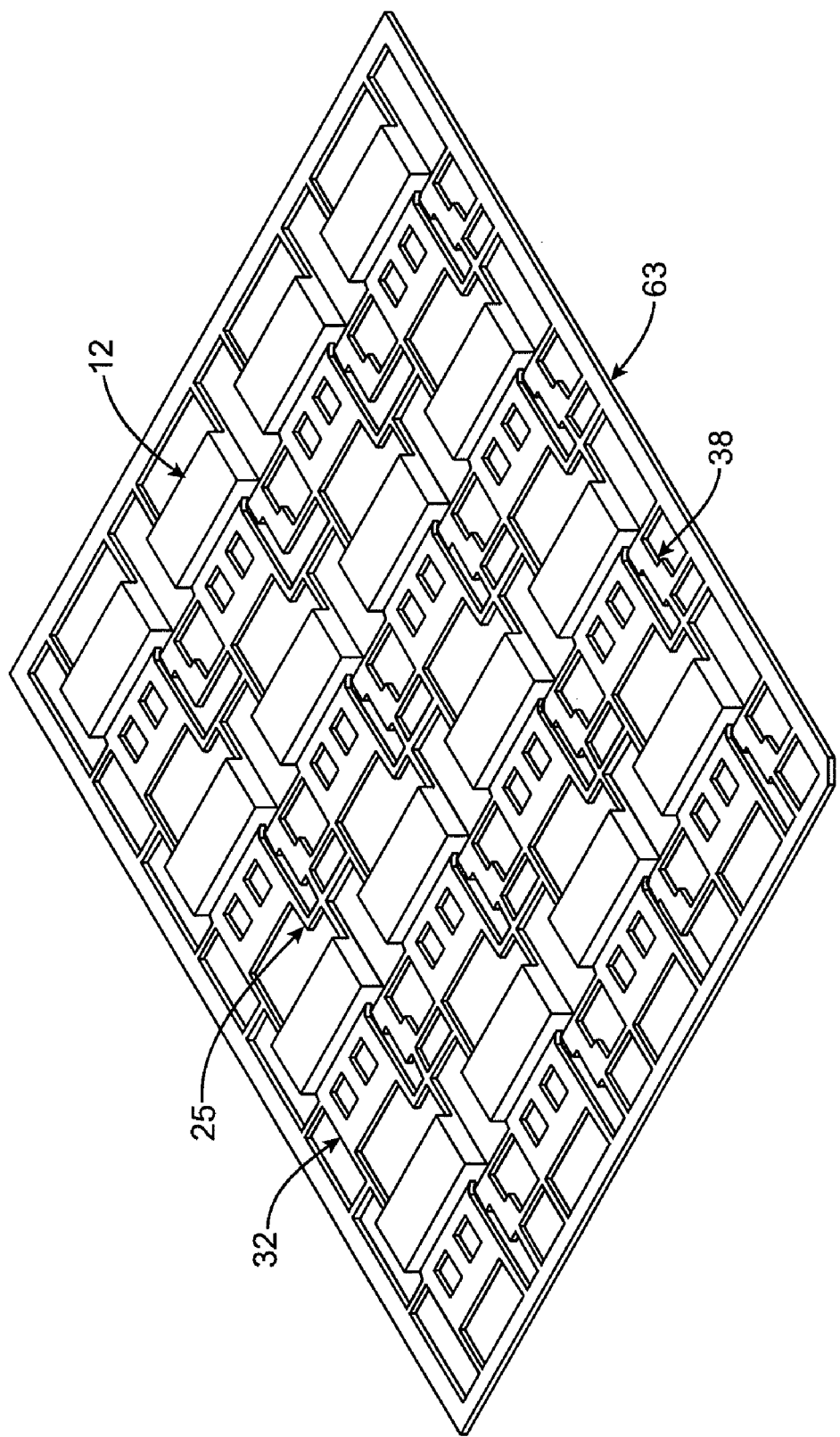
FIG. 7 shows a 16-unit dual gauge clip.

An array of clip structures 63 (as shown in FIG. 7) is also obtained in any suitable manner including etching, stamping, etc. The array of clip structures 63 may include a side rails which frame sixteen clip structures. The clip structures may be held together with tie bars 25.

Figure 8:
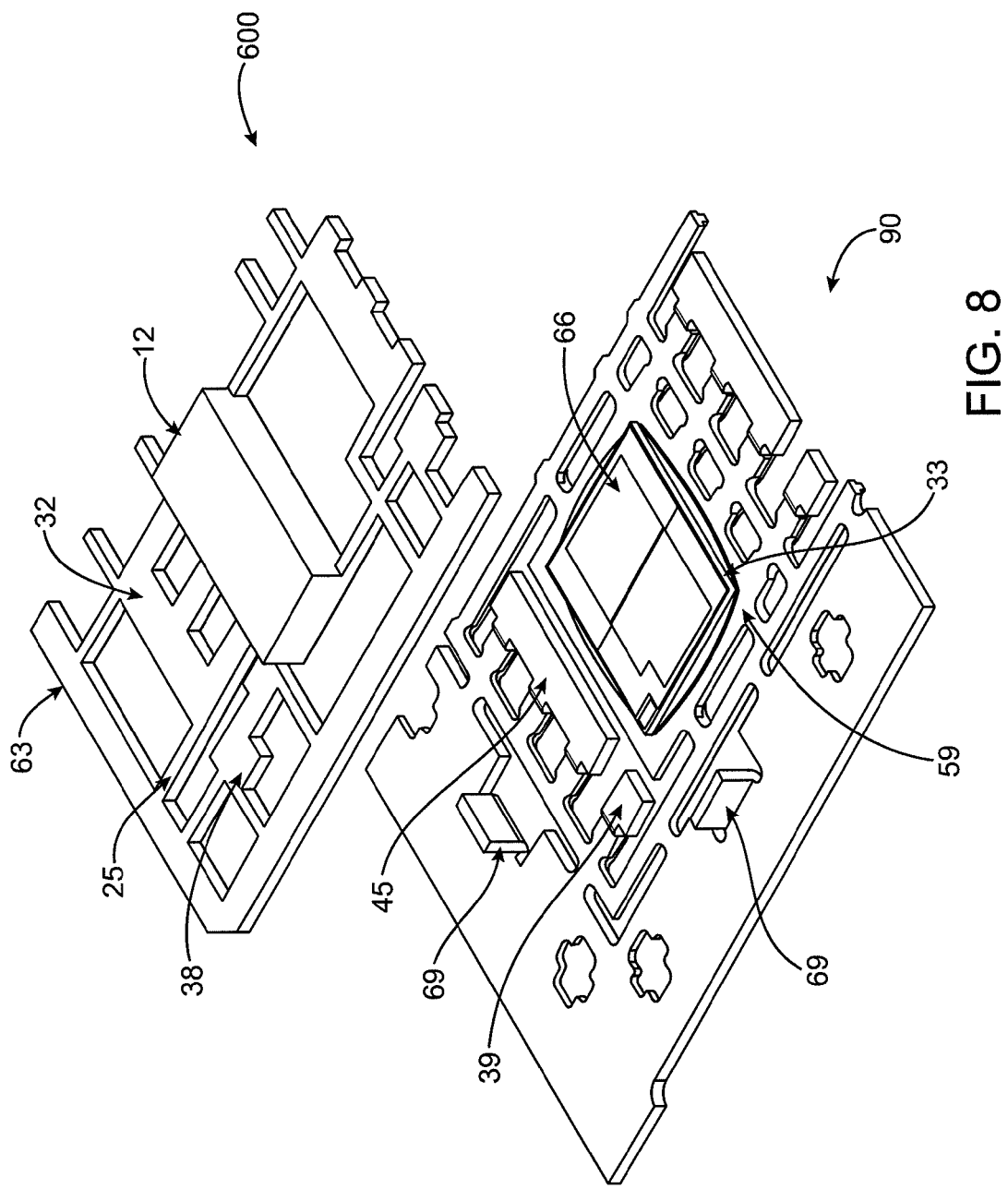
FIG. 8 shows an exploded view of a semiconductor die package according to an embodiment of the invention, without an overlying molding material.

A plurality of semiconductor dies is attached to the die attach pads of the leadframe structures in the array of leadframe structures. FIG. 8 shows a clip structure 600 as part of a clip structure array 63, as well as a leadframe structure as part of a leadframe structure array, and a semiconductor die 33. The semiconductor die 33 is attached to the die attach pad of the leadframe structure 90 using a conductive adhesive 59 such as solder. A solderable top metal 66 is on the semiconductor die 33.

Figure 9:
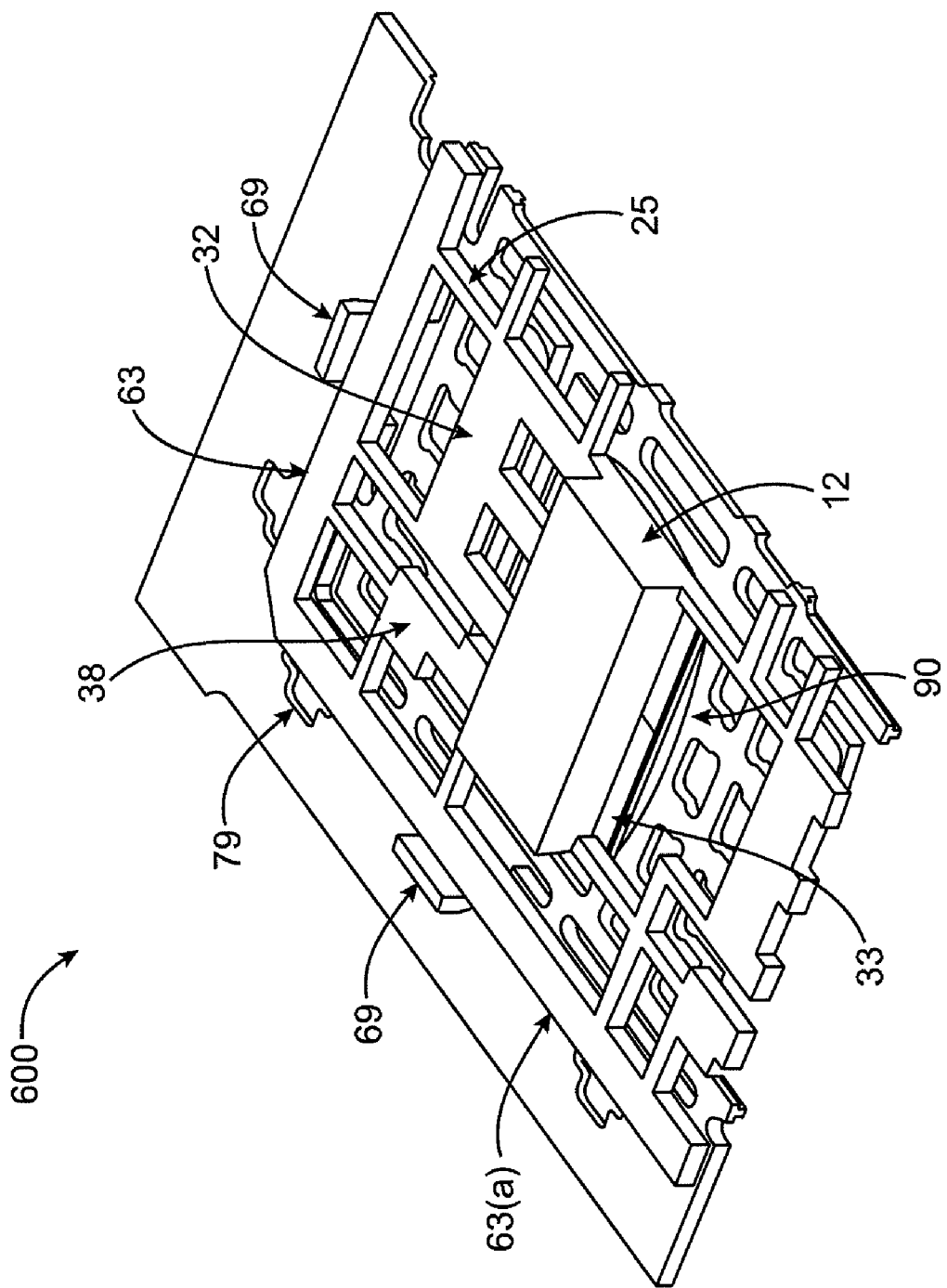
FIG. 9 shows a three-dimensional perspective view of a semiconductor die package according to an embodiment of the invention, without an overlying molding material.

As shown in FIG. 9, the folded tabs 69 (which are perpendicular to the orientation of the clip structure array 63) can form stops for clip side rails 63(a) to align the clip structure array 63 with respect to the leadframe structure 90. The protruding portion 12 lies over the semiconductor die 33 and is attached thereto by solder.

Figure 10:
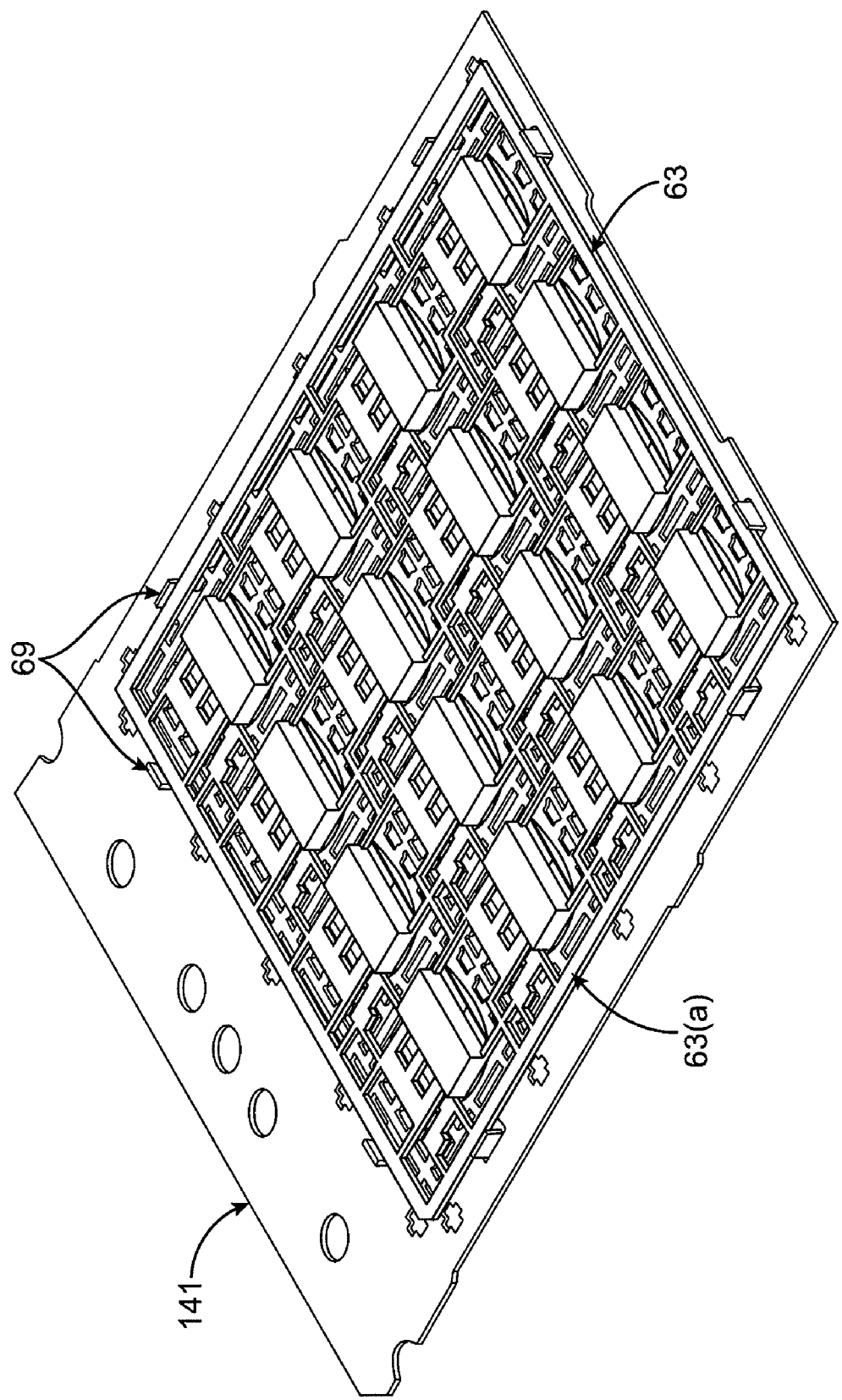
FIG. 10 shows a perspective view of an array of assembled units.

FIG. 10 shows a leadframe structure array 141 coupled to a clip structure array 63. As shown, the tabs 69 can be used to align the leadframe structure and clip arrays 141, 63 with respect to each other.

At this point, solder that is used to couple the leadframe structure array 141 and the clip array 63 to the semiconductor dies can be reflowed using conventional reflow processing.

Figure 11:
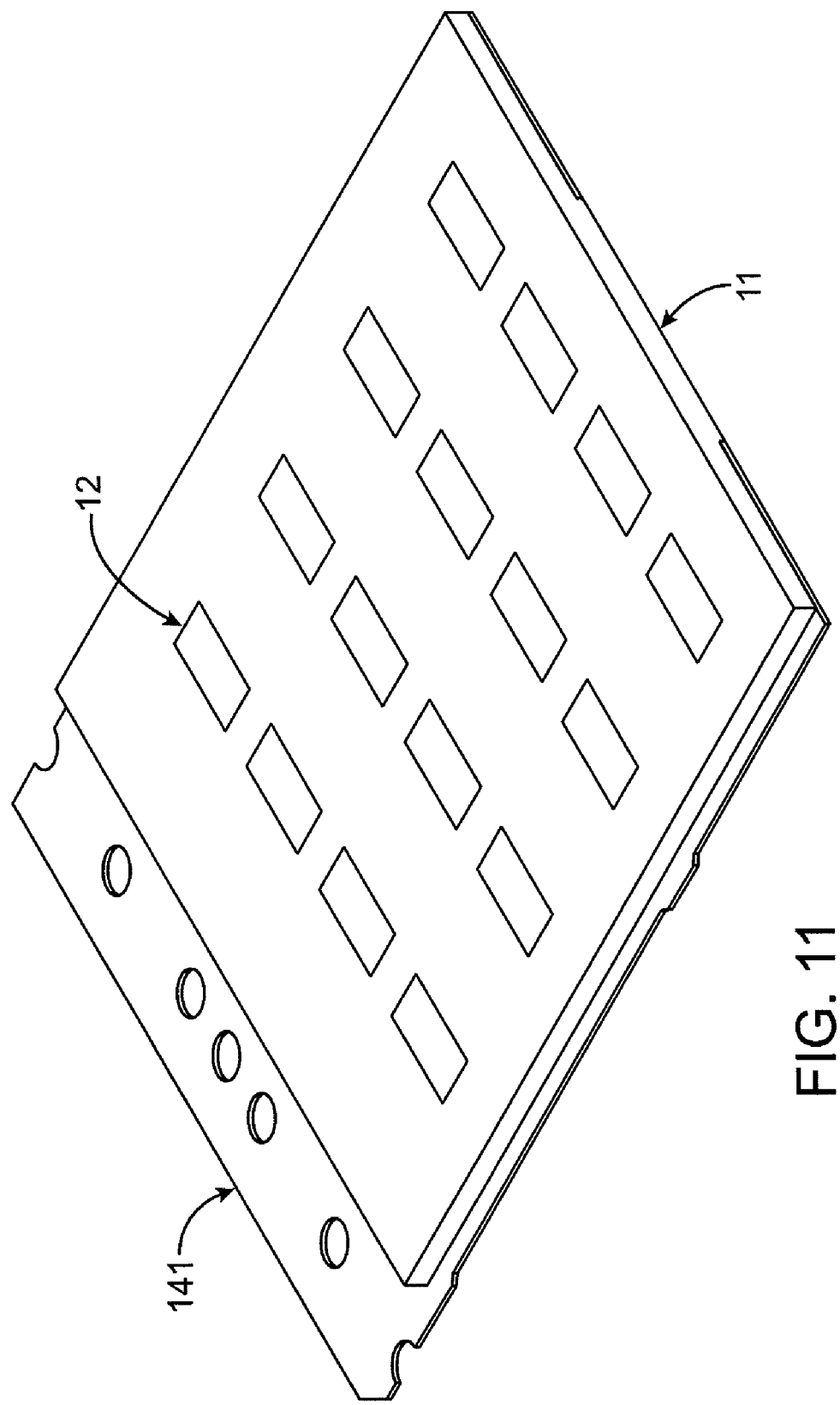
FIG. 11 shows a top view of a sixteen unit molded panel.

As shown in FIG. 11, a molding material 11 can be formed around the leadframe structure array 141, the clip array 63, and the semiconductor dies (now shown). Any suitable molding processing conditions may be used.

Figure 12:
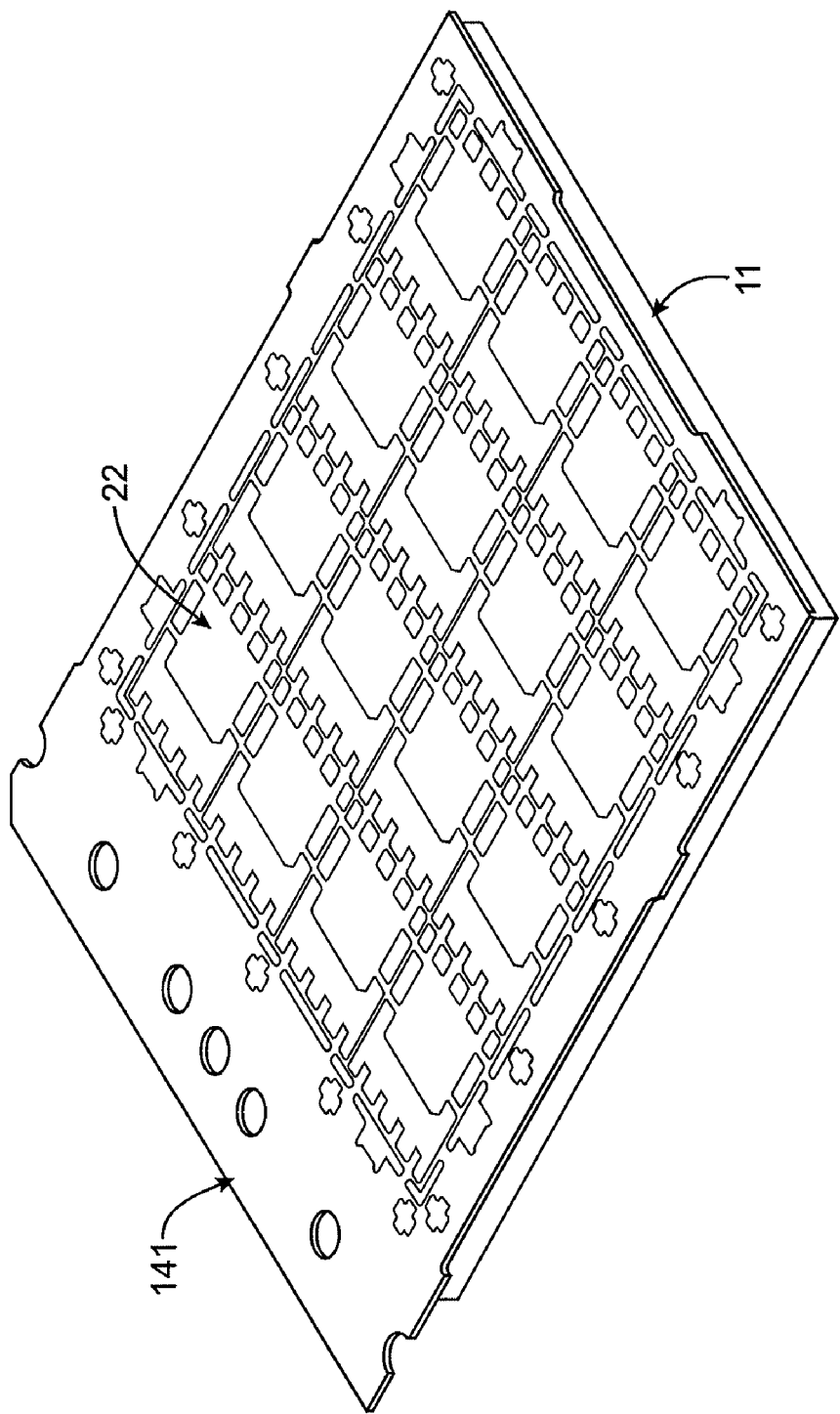
FIG. 12 shows a bottom view of a sixteen unit molded panel.

FIG. 12 shows a bottom perspective view of a molded array of semiconductor die packages.

After molding, the semiconductor die packages in the array can be singulated (i.e., separated from each other), and then marked and/or tested.

Embodiments of the invention have a number of advantages. For example, embodiments of the invention are compatible with the footprint of MLP, LFPAK, and S08 type packages, since the thermal drain is at the bottom of the semiconductor die package. Second, the source and gate clip interconnection is a one piece design. The process of interconnecting the gate and source is performed in a single process step (without wirebonding) and only one reflow process needs to be used. In the semiconductor die packages, the gate metal connection can be isolated from a source metal connection after the sawing. Further, the frame design for the leadframe structures has folded tabs, which serve as a location mechanism for a clip frame array during the clip attach process. Also, the clip frame can be a dual gauge frame. The source protruding portion can be at least about twice as thick as the other portions of the clip structure. This provides good heat dissipation from the semiconductor die from both the top and bottom of the die. Lastly, dies of different sizes can be mounted on a die attach pad with a standard foot print.

Any of the above-described packages can be used in an electrical assembly, which may include a package mounted to a circuit substrate such as a circuit board. Such assemblies may also be used in systems such as server computers, cell phones, etc.

Any one or more features of one or more embodiments may be combined with one or more features of any other embodiment without departing from the scope of the invention.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. For example, although semiconductor die packages with a single die are specifically disclosed, embodiments of the invention can also include semiconductor die packages with two or more semiconductor dies within them.

What is claimed is:

1. A semiconductor die package comprising:
   a leadframe structure comprising a first lead structure comprising a die attach pad, a second lead structure, and a third lead structure;
   a semiconductor die comprising a first surface and a second surface, the semiconductor die on the die attach pad, wherein the second surface is proximate the die attach pad;
   a clip structure comprising a first interconnect structure and a second interconnect structure, the first interconnect structure comprising a planar portion and a protruding portion, the protruding portion comprising an exterior surface and side surfaces defining the exterior surface, the protruding portion extending from the planar portion of the first interconnect structure, wherein the first surface of the semiconductor die is proximate to the clip structure; and
   a molding material covering at least the semiconductor die and at least a portion of the side surfaces of the protruding portion,
   wherein the first interconnect structure and the second interconnect structure each comprise a completely flat interior surface,
   wherein the interior surfaces of the first interconnect structure and the second interconnect structure are in a same plane, and
   wherein the protruding portion overlaps with at least 50% of the first surface of the semiconductor die.

2. The semiconductor die package of claim 1 wherein the leadframe structure comprises copper.

3. The semiconductor die package of claim 1 wherein the semiconductor die comprises a power MOSFET.

4. The semiconductor die package of claim 1 wherein the clip structure is a dual gauge clip structure.

5. The semiconductor die package of claim 1 wherein the molding material has a first surface and a second surface opposite to the first surface, wherein the first surface is substantially coplanar with the protruding portion exterior surface.

6. The semiconductor die package of claim 5 wherein the second surface of the molding material is substantially coplanar with the leadframe structure exterior surface.

7. The semiconductor die package of claim 1 wherein the semiconductor die package is a PQFN type package.

8. The semiconductor die package of claim 1 wherein the molding material comprises an epoxy molding material.

9. The semiconductor die package of claim 1 further comprising a first solder between the leadframe structure and the semiconductor die and a second solder between the semiconductor die and the clip structure.

10. The semiconductor die package of claim 1 wherein first lead structure is a drain lead structure, the second lead structure is a source lead structure and the third lead structure is a gate lead structure.

11. The semiconductor die package of claim 1 wherein the first interconnect structure is a source interconnect structure, and wherein the semiconductor die package further comprises solder coupling the first interconnect structure and the second lead structure.

12. An electrical assembly comprising a circuit substrate; and the semiconductor die package of claim 1 attached to the circuit substrate.

13. A system comprising the electrical assembly of claim 12.

14. A method of making a semiconductor die package, the method comprising:
   a) obtaining an array of leadframe structures, each leadframe structure comprising a first lead structure comprising a die attach pad, a second lead structure, and a third lead structure;

b) attaching a plurality of semiconductor dies to the die attach pads of the leadframe structures in the array of leadframe structures;

c) attaching an array of clip structures to the semiconductor dies in the plurality of semiconductor dies, wherein each clip structure comprises a first interconnect structure and a second interconnect structure, the first interconnect structure comprising a planar portion and a protruding portion comprising an exterior surface and side surfaces defining the exterior surface, the protruding portion extending from the planar portion of the first interconnect structure; and d) molding a molding material around at least a portion of the clip structures, semiconductor dies, and leadframe structures to form the semiconductor die package, wherein the exterior surface of each of the clip structures is exposed through the molding material, wherein the first interconnect structure and the second interconnect structure each comprise a completely flat interior surface, and wherein the interior surfaces of the first interconnect structure and the second interconnect structure are in a same plane in the semiconductor die package, and wherein the protruding portion overlaps with at least 50% of the first surface of the semiconductor die in the semiconductor die package.

15. The method of claim 14 wherein the semiconductor die comprises a power MOSFET.

16. The method of claim 14 wherein the array of clip structures is present in a clip array structure comprising a frame around the array of clip structures, and wherein the array of leadframe structures is part of a leadframe array structure, wherein the leadframe array structures comprises a plurality of folded tabs configured to engage at least a portion of the array of clip structures.

17. The method of claim 16 wherein the portion of the array of clip structure includes a frame surface.

18. The semiconductor die package of claim 1 wherein the protruding portion further extends from a second planar portion of the first interconnect structure, the protruding portion being located between the planar portion and the second planar portion.

19. The semiconductor die package of claim 18 wherein the semiconductor die is a power MOSFET.

20. The semiconductor die package of claim 1 wherein the protruding portion is between about 8 and 20 mils thick.

\* \* \* \* \*